United States Patent
Aschenbrenner et al.

(10) Patent No.: US 6,721,456 B1
(45) Date of Patent: Apr. 13, 2004

(54) COLOR IMAGE DATA AND CONTROL BIT COMPRESSION SCHEME WITH RUN LENGTH ENCODING

(75) Inventors: Jean Margaret Aschenbrenner, Boulder, CO (US); Stephen Dale Hanna, Longmont, CO (US); John Thomas Varga, Longmont, CO (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/511,132

(22) Filed: Feb. 23, 2000

(51) Int. Cl.$^7$ .......................... G06K 9/36; H03M 7/46; H04N 1/413
(52) U.S. Cl. .................. 382/233; 382/245; 341/63; 375/240.23; 358/426.13
(58) Field of Search ................ 382/245, 232, 382/233; 704/503, 504; 348/14.13; 358/426.13, 426.16; 379/100.17; 341/59, 67, 63; 375/240.23

(56) References Cited

U.S. PATENT DOCUMENTS

| | | | |
|---|---|---|---|
| 4,800,441 A | | 1/1989 | Sato ........................ 358/261.1 |
| 4,811,113 A | * | 3/1989 | Ozeki et al. ................ 382/245 |
| 5,049,880 A | * | 9/1991 | Stevens ....................... 341/63 |
| 5,625,712 A | | 4/1997 | Schoenzeit et al. ......... 382/232 |
| RE35,657 E | | 11/1997 | Buckley et al. ............. 358/296 |
| 5,721,720 A | * | 2/1998 | Kikuchi et al. .......... 369/275.3 |
| 5,727,090 A | * | 3/1998 | Yellin ........................ 382/245 |
| 5,758,007 A | * | 5/1998 | Kitamura et al. ............ 386/45 |
| 5,809,172 A | | 9/1998 | Melen ........................ 382/232 |
| 5,812,119 A | | 9/1998 | Tateyama ................... 345/202 |
| 5,832,130 A | | 11/1998 | Kim ........................... 382/248 |
| 5,845,021 A | | 12/1998 | Kikuchi et al. ............. 382/232 |
| 5,852,742 A | | 12/1998 | Vondran, Jr. et al. ... 395/800.28 |
| 5,857,035 A | | 1/1999 | Rust ........................... 382/247 |
| 5,867,612 A | | 2/1999 | Robson ...................... 382/298 |
| 6,416,410 B1 | * | 7/2002 | Abou-Samra et al. ........ 463/31 |
| 6,535,150 B1 | * | 3/2003 | Ross ........................... 341/67 |

FOREIGN PATENT DOCUMENTS

| | | | |
|---|---|---|---|
| EP | 0886205 | 12/1998 | ............. G06F/3/12 |
| EP | 0886235 | 12/1998 | .......... G06K/15/00 |
| EP | 0886435 | 12/1998 | ............. H04N/1/40 |
| EP | 0886208 | 3/1999 | ............. G06F/7/32 |

OTHER PUBLICATIONS

Murray et al, Encyclopedia of Graphics File Formats, Apr. 1996, O'Reilly & Associates, Inc, Second Edition, p. 160–190 and 962.*

IBM Technical Disclosure Bulletin, "Reduced Run–Length Encoding for Bi–Level Image Compression," IBM TDB vol. 38, No. 2, Feb. 1995., pp. 295–296.

(List continued on next page.)

*Primary Examiner*—Bhavesh M. Mehta
*Assistant Examiner*—Christopher Sukhaphadhana
(74) *Attorney, Agent, or Firm*—Blakely Sokoloff Taylor Zafman LLP (57) ABSTRACT

A method of compressing pixel information is described. The pixel data is received in a data stream and compressed into a compressed data format by identifying a run of consecutive bytes of the data stream based on the similarity of the consecutive data bytes in the data stream. A mode bit of a compression byte is used to indicate whether a run of consecutive bytes is identified. Count bits of the compression byte are used to indicate the number of times the data bytes are repeated and zero counts may be used to indicate particular types of runs, for example, runs to the end of a scan line and the end of an object. Where a pixel byte is represented by 8 bits, the data stream may be compressed in multiples of four bytes at a time. If a pixel is represent by less than 8 bits, the compression method may look for repetitions of similar bytes one byte at a time.

24 Claims, 8 Drawing Sheets

OTHER PUBLICATIONS

IBM Technical Disclosure Bulleten, "Apparatus and Associated Method for Compression/Decompression of Color Digital Information," IBM TDB vol. 40, No. 9, Sep. 1997, pp. 43–44.

Fung, HT; Parker KJ, *Color, complex document segmentation and compression*, Abstract from Conference: Document Recognition IV, San Jose, CA, Feb. 12–13, 1997; 2 pages.

Godfrey, KRL; Attikiouzel, Y, *Self–organized color image quantization for color image data compression*, Abstract from 1993 IEEE Int'l Conference on Neural Networks; 1 page.

Yfantis, EA, et al.; *An image compression algorithm and its implementation*, Abstract from Finite Fields, Coding Theory and Advances in Communications and Computing, 1993; 1 page.

*Image Processing Algorithms and Techniques III*, Abstract from the Proceedings of the SPIE, vol. 1657, Feb. 10–13, 1992; 1 page.

Aizu, M; Nakagawa, O; *Color printing image coding using vector quantization*, Abstract from the Journal of Visual Communication and Image Representation, vol. 2, No. 3, Sep. 1991; 1 page.

Jaisimha, MY, et al.; *Data compression techniques for maps*, Abstract from SOUTHEASTCON '89 Proceedings. Energy and Information Technologies in the Southeast, Apr. 9–12, '89; 1 page.

Goel, BD; Kwatra, SC; *A data compression algorithm for color images based on run–length coding and fractal geometry*, Abstract from IEEE Int'l Conf. on Communications, Jun. '88; 1 page.

Kato, S; Yasuda, Y; *Dithering methods of color images directly applicable to run–length coding*, Abstract from GLOBECOM Tokyo '87; Tokyo, Japan, Nov. 15–18, 1987; 1 page.

Patent Abstract from EP–717555 A/US–355594 filed Dec. 14, 1994; 1 page.

Patent Abstract from US–355594 dated Jan. 24, 1989; 1 page.

Patent Abstract from EP–512810 A/US–696681, filed May 7, 1991; 1 page.

\* cited by examiner

| BYTE | BIT NUMBER | | | | | | | | DESCRIPTION |
|---|---|---|---|---|---|---|---|---|---|
| | 7 | 6 | 5 | 4 | 3 | 2 | 1 | 0 | |
| 0 | MODE BIT =1 | N6 717 | N5 716 | N4 715 | N3 714 | N2 713 | N1 712 | N0 711 | COMPRESSION TYPE & REPEAT COUNT 710 |
| 1 | N7-MSB | N6 | N5 | N4 | N3 | N2 | N1 | N0-LSB | DATA (1 BYTE) 720 |

| BYTE | BIT NUMBER | | | | | | | | DESCRIPTION |
|---|---|---|---|---|---|---|---|---|---|
| | 7 | 6 | 5 | 4 | 3 | 2 | 1 | 0 | |
| 0 | MODE BIT =0 | N6 747 | N5 746 | N4 745 | N3 744 | N2 743 | N1 742 | N0-LSB 741 | COMPRESSION TYPE & "AS IS" COUNT 730 |
| 1 | N7-MSB | N6 | N5 | N4 | N3 | N2 | N1 | N0-LSB | DATA (1 BYTE) |
| 2 | N7-MSB | N6 | N5 | N4 | N3 | N2 | N1 | N0-LSB | DATA (1 BYTE) |
| 3 | N7-MSB | N6 | N5 | N4 | N3 | N2 | N1 | N0-LSB | DATA (1 BYTE) |
| 4 | N7-MSB | N6 | N5 | N4 | N3 | N2 | N1 | N0-LSB | DATA (1 BYTE) |
| 4 X N | N7-MSB | N6 | N5 | N4 | N3 | N2 | N1 | N0-LSB | DATA (1 BYTE) |

731

740

| BYTE | BIT NUMBER | | | | | | | | DESCRIPTION |
|---|---|---|---|---|---|---|---|---|---|
| | 7 | 6 | 5 | 4 | 3 | 2 | 1 | 0 | |
| 0 | MODE BIT = 1 | N6 | N5 | N4 | N3 | N2 | N1 | N0 | COMPRESSION TYPE & REPEAT COUNT — 810 |
| 1 | N7-MSB | N6 | N5 | N4 | N3 | N2 | N1 | N0-LSB | DATA (1 BYTE) — 820 |

811

| BYTE | BIT NUMBER | | | | | | | | DESCRIPTION |
|---|---|---|---|---|---|---|---|---|---|
| | 7 | 6 | 5 | 4 | 3 | 2 | 1 | 0 | |
| 0 | MODE BIT = 0 | N6 | N5 | N4 | N3 | N2 | N1 | N0 | COMPRESSION TYPE & "AS IS" COUNT |
| 1 | N7-MSB | N6 | N5 | N4 | N3 | N2 | N1 | N0-LSB | DATA (1 BYTE) |
| 2 | N7-MSB | N6 | N5 | N4 | N3 | N2 | N1 | N0-LSB | DATA (1 BYTE) |
| 3 | N7-MSB | N6 | N5 | N4 | N3 | N2 | N1 | N0-LSB | DATA (1 BYTE) |
| 4 | N7-MSB | N6 | N5 | N4 | N3 | N2 | N1 | N0-LSB | DATA (1 BYTE) |
| N | N7-MSB | N6 | N5 | N4 | N3 | N2 | N1 | N0-LSB | DATA (1 BYTE) |

COLOR IMAGE DATA AND CONTROL BIT COMPRESSION SCHEME WITH RUN LENGTH ENCODING

FIELD OF THE INVENTION

This invention relates to the field of data compression schemes and, more specifically, to data compression schemes using run length encoding.

BACKGROUND

Printer systems have a series of hardware and software operations through which digital data passes in preparation for printing, referred to as a pipeline. The digital data is used by a print engine to form a print image on a print surface using, for examples, a scanning laser beam or an inkjet. An area of the print surface on which the image is formed is referred to as a picture element (pel or pixel). One scan of the laser beam across the print surface forms a row of pixels, referred to as a scan row. As such, the print image is formed with multiple scan rows.

The type of data that passes through the pipeline may include both text, graphics, and image. As printers increase the density of dot placements, particularly with color printing that requires additional bits per pixel over monochrome printing, the time required for the printer's data pipeline to transmit the data becomes substantial. To fully utilize the increasing print speed capabilities of print engines, the pipeline of a printer system must be able to transfer data sufficiently fast to supply a continuous stream of data to the print engine, thereby allowing the print engine to print continuously.

Figure 1:
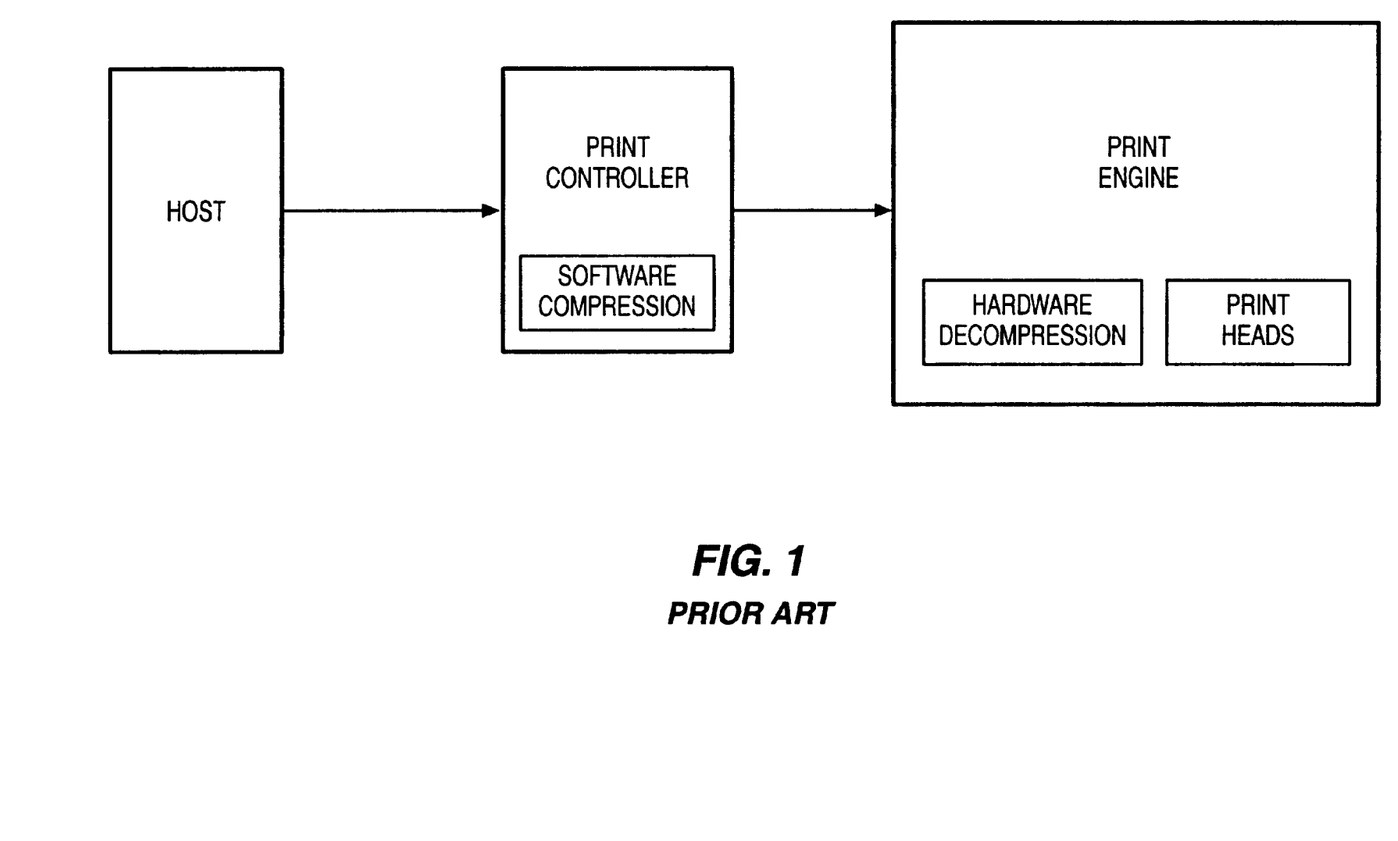
FIG. 1 illustrates one prior art printer system that uses software data compression and decompression techniques.

FIG. 1 illustrates one type of printer system that uses data compression and decompression techniques to reduce data size such that data may be transmitted faster through a printer's pipeline. Data compression refers to a process that attempts to convert data in a given format into an alternative format requiring less space than the original. As such, data compressions systems effect a savings in the amount of storage required to hold, or the amount of time required to transmit, a given body of digital information.

With one type of compression method, referred to as run length encoding, the length of continuous identical pixel data is converted into a run length code for transmission. For example, using one run length compression method, the pixel data line "aaaabbbbbbbccccccdd" is converted into the coded data "a4b7c5d2." The coded data consists of bytes of pixel information (a, b, c, and d) and the number of those bytes that are the same (4, 7, 5, and 2). Each byte contains 8 bits of pixel information. Such a byte based compression method may still not provide enough reduction in storage space or transmit time that may be required by current print engines. Further, it is possible that the size of the compressed data may be larger than the size of the original data.

Another problem with some compression methods is that they may not be targeted to handle multiple bits/pixel. Furthermore, prior compression methods may not be efficient to decode in terms of output bandwidth.

SUMMARY OF THE INVENTION

The present invention provides a method of data compression. The method may include receiving a data stream having a plurality of bytes and compressing the data stream into a compressed data format by identifying a run of consecutive bytes of the data stream based on the similarity of the consecutive bytes.

Additional features and advantages of the present invention will be apparent from the accompanying drawings and from the detailed description that follows.

BRIEF DESCRIPTION OF THE DRAWINGS

The present invention is illustrated by way of example, and not by way of limitation, in the figures of the accompanying drawings and in which.

DETAILED DESCRIPTION

In the following description, numerous specific details are set forth such as examples of specific circuits, components, data formats, etc. in order to provide a thorough understanding of the present invention. It should be appreciated, however, that these specific details need not be employed to practice the present invention. In other instances, well known structures and circuits have not been described in detail in order to avoid unnecessarily obscuring the present invention.

Figure 2:
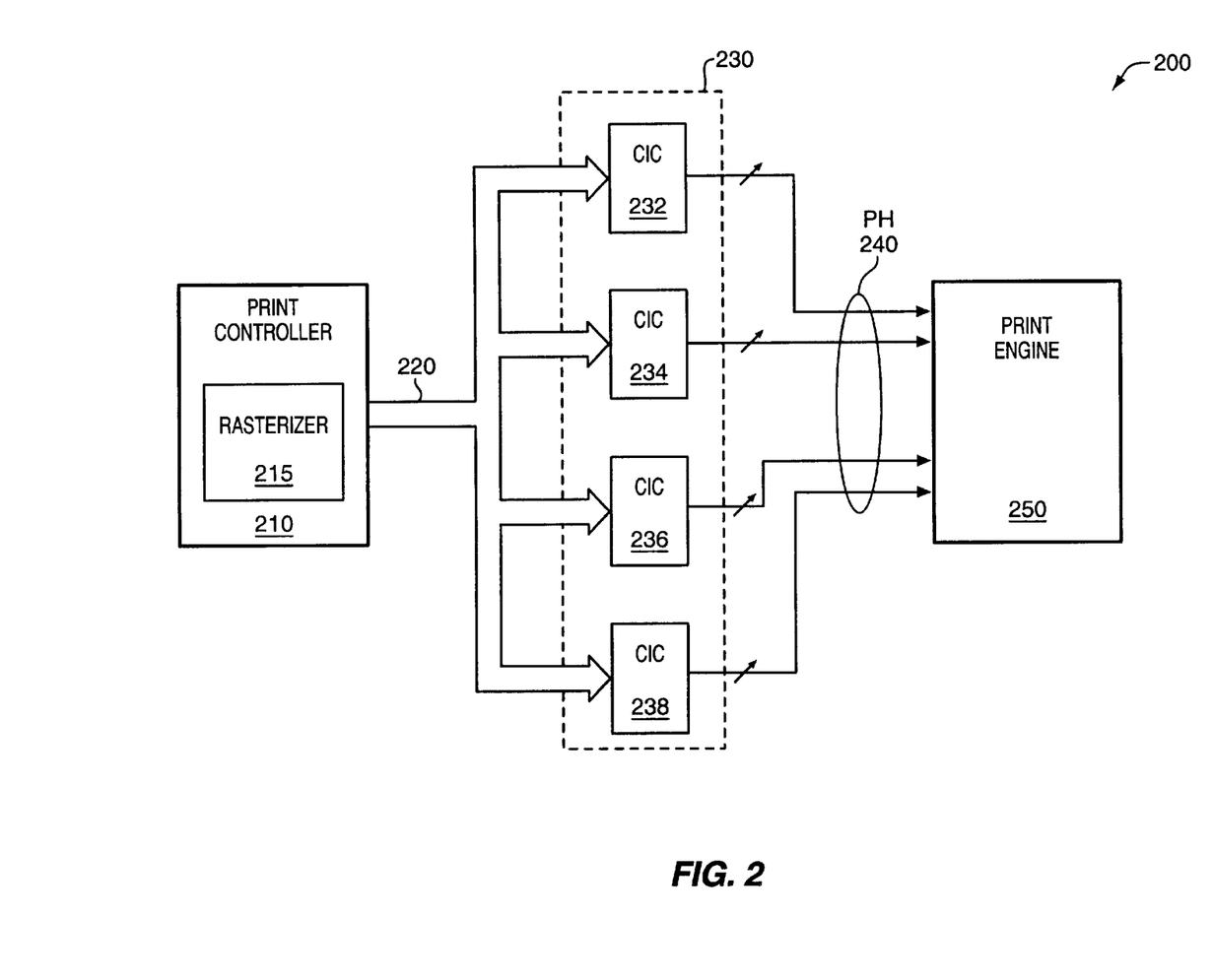
FIG. 2 illustrates one embodiment of a printing system.

FIG. 2 illustrates one embodiment of a printing system. In one embodiment, printing system 200 includes print controller 210, multiple color interface cards (CIC) 230, and print engine 250. Print controller 210 may include a rasterizer 215. Rasterizer 215 makes a raster image of data and then compresses the data, or part thereof, as objects and sends the objects to CICs 230 via bus 220. The objects transmitted to CICs 230 may include text and/or images from a print page stored in print controller 210. CICs 230 decompress the objects to generate one or more bit maps that may be transmitted to print engine 250.

In one embodiment, rasterizer 215 processes an input data stream that describes what is printed by print engine 250. Rasterizer 215 converts input data into bitmaps in a format for the hardware and compresses bitmaps so that they may be decompressed. The output of rasterizer 215 allows CICs 230 to render the objects by driving output devices, such as lasers or LEDs, within print engine 250. In an alternative embodiment, the method described herein may be used in data networks to compress/decompress objects and render the objects on a screen by driving output devices such as LCD arrays within a computer monitor.

In one embodiment, each CIC 232, 234, 236, and 238 contains hardware to generate printhead (PH) signals 240. The signals describe continuous tone (CT) data, line work (LW) data, and line work control (LWC) data which have been merged.

Figure 3:
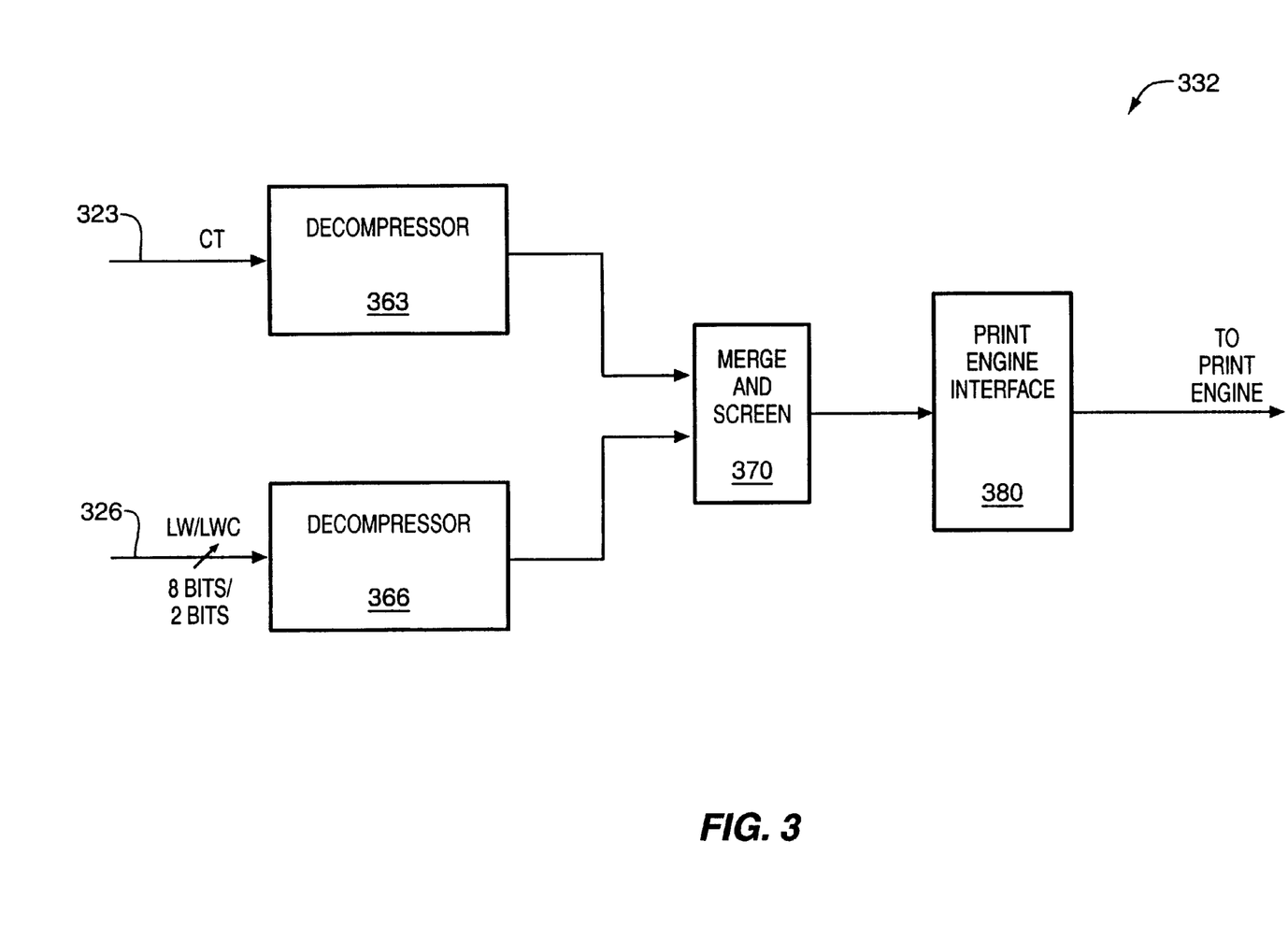
FIG. 3 illustrates one embodiment of a color interface card.

FIG. 3 illustrates one embodiment of a color interface card. In one embodiment, CIC 332 includes decompressors 363 and 366, merge and screen circuitry 370, and print engine interface 380. Decompressors 363 and 366 are coupled to receive CT data 323, and LW and LWC data 326, respectively, from print controller 210 of FIG. 2. In one embodiment, rasterizer 215 of FIG. 2 separates and transmits CT and LW/LWC data to the CICs. The LW and LWC data may be compressed using the compression methods discussed below.

Figure 4:
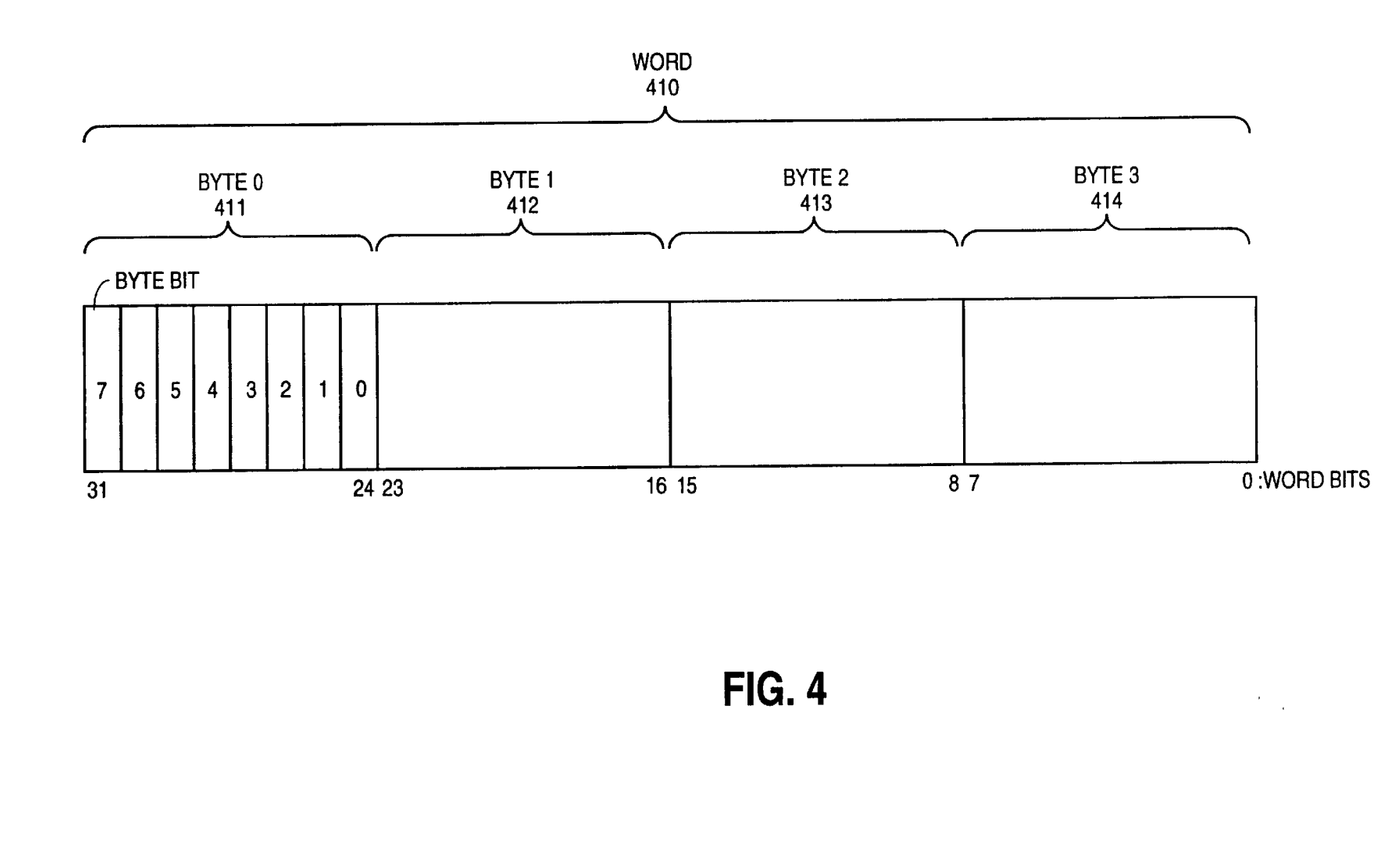
FIG. 4 illustrates one embodiment of a data stream format.

FIG. 4 illustrates one embodiment of an uncompressed pixel data format. In one embodiment, a word 410 is defined as 4 bytes (411, 412, 413 and 414), or 32 bits. A byte represents one pixel, and the 8 bits (e.g., words bits 31-24) of a byte/pixel may be used, for example, to represent the color for that one pixel.

In one embodiment, an object, defined by the pixel data, may be a rectangle having multiple bytes per scan line. The pixel data for the rectangle may be evaluated one scan line at a time to determine if the pixel data may be compressed. If consecutive pixel data is identified to be same, the consecutive pixel data may be represented in a compressed format to provide the same pixel data information in a reduced space. In one embodiment, the compressed object represented by the data stream is assumed to have a scan length that is a multiple of 4 pixels (32 bits).

It should be noted that the compression method is not limited to the evaluation of pixel data one scan line at a time. In an alternative embodiment, the scan line boundaries may be ignored in order to provide the best compression. For example, a rectangle may have a width significantly less than the maximum run. As such, it may be more efficient to compress a series of identical scan line runs with a single run which encompasses those scan lines rather than as a series of end of scan (EOS) codes, one per scan line, as discussed in further detail below in relation to FIG. 7A.

Figure 5:
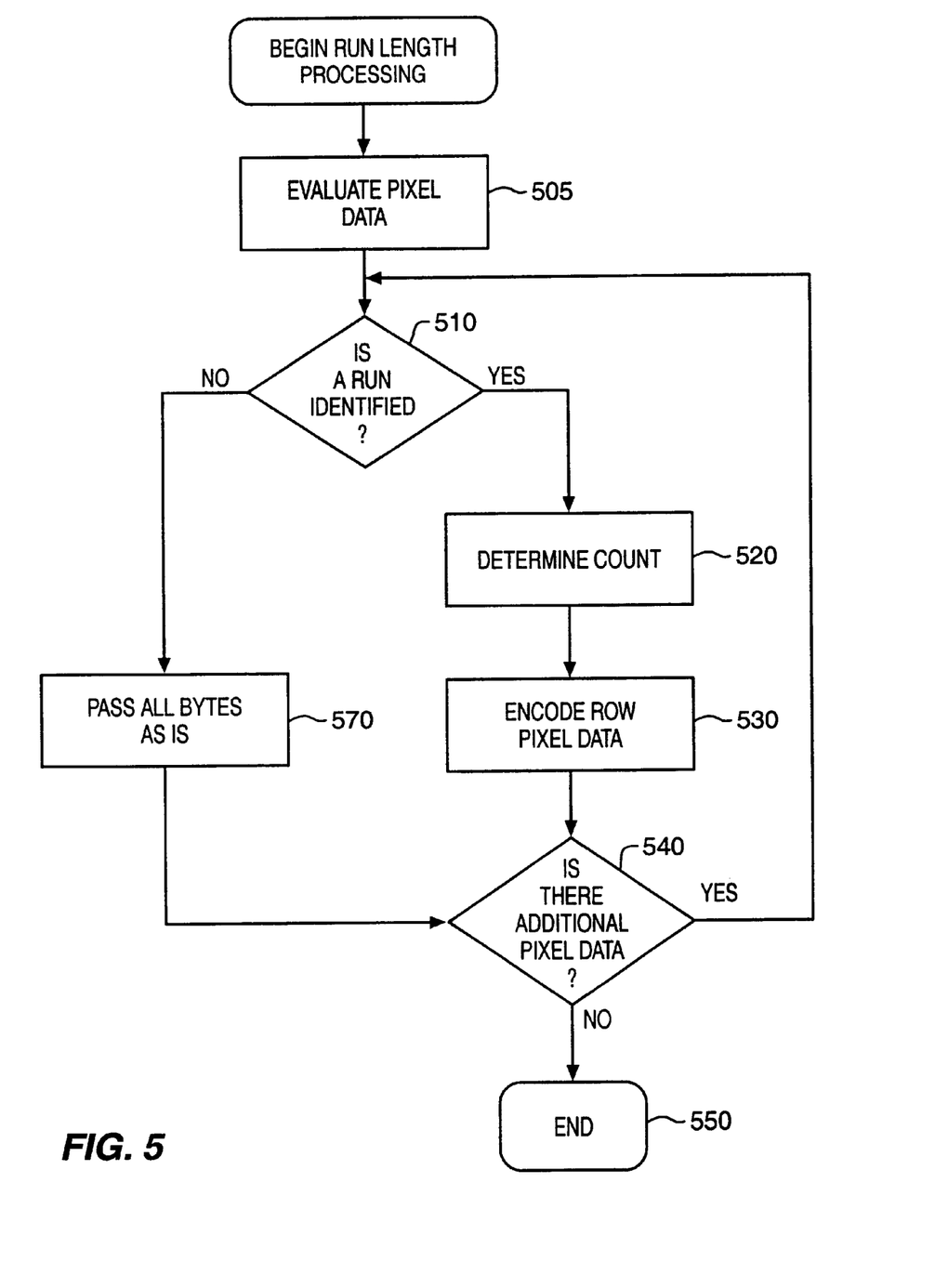
FIG. 5 illustrates one embodiment of a compression method.

FIG. 5 illustrates one embodiment of a compression method. First, the pixel data is evaluated to determine if a run is present in the data stream, step 505. A run may be four or more consecutive bytes that are the same, based on a bit-wise comparison of the bytes. In one embodiment, a run is defined, for example, as a multiple of 4 bytes of pixel data that are identical (e.g., 4, 8, 12, etc.). If a run is identified, step 510, then a count is determined based on the number of byte multiples that are the same, step 520. The run is then encoded into a data format using the count, the number of similar byte multiples, and the actual value of the byte, step 530.

Figure 7A:
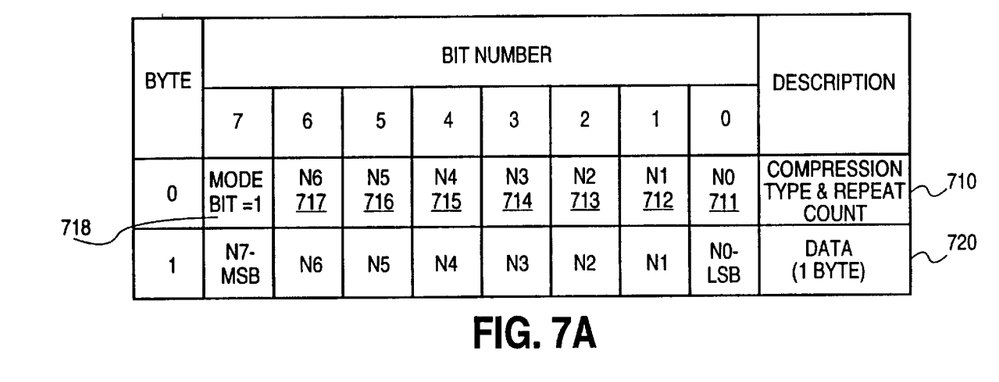
FIG. 7A illustrates one embodiment of a compressed data format for an identified run.

One embodiment of the compressed data format for an identified run is illustrated in FIG. 7A. The compressed data format for an identified run consists of a compression type/count byte 710 and a data byte 720. The compression type/count byte 710 consists of a mode bit 718 and seven count bits 711–717. If a run is identified, step 510 of FIG. 5, the mode bit 718 is set to one. The count bits 711–717 are set to indicate the number of four byte multiples of similar bytes in that run. For example, if 112 bytes in a data stream are identical, a run is identified, step 510 of FIG. 5, and the 112 bytes is divided by 4 to determine the count. As such, mode bit 718 is set to 1 and the count bits 711–717 are set to a value of 28. The next byte 720 in the compressed data format is a data byte and is set to the value of the identical bytes.

As such the count bits 711–717 will typically be set to have an integer value equal to or greater than one. A count of zero may have special significance in that it may be used to indicate a particular type of run. In the case where a run is identified to the end of a scan line, the mode bit 718 may be set to one to indicate the run and the count bits 711–717 may be set to zero. Where a run is identified to the end of an object, the mode bit and the count bits maybe set to zero. Although a mode bit of zero will typically indicate a non-run as discussed below in relation to FIG. 7B, setting both the mode bit and the counts bits to zero may be used to indicate a run to the end of an object.

Referring again to FIG. 5, if there is additional pixel data, step 540, the process loops back to be repeated until the data stream is complete, step 550. Portions of the data stream that do not contain a run are encoded into another data format using the count of all the bytes and by passing the bytes as they are, step 570.

Figure 7B:
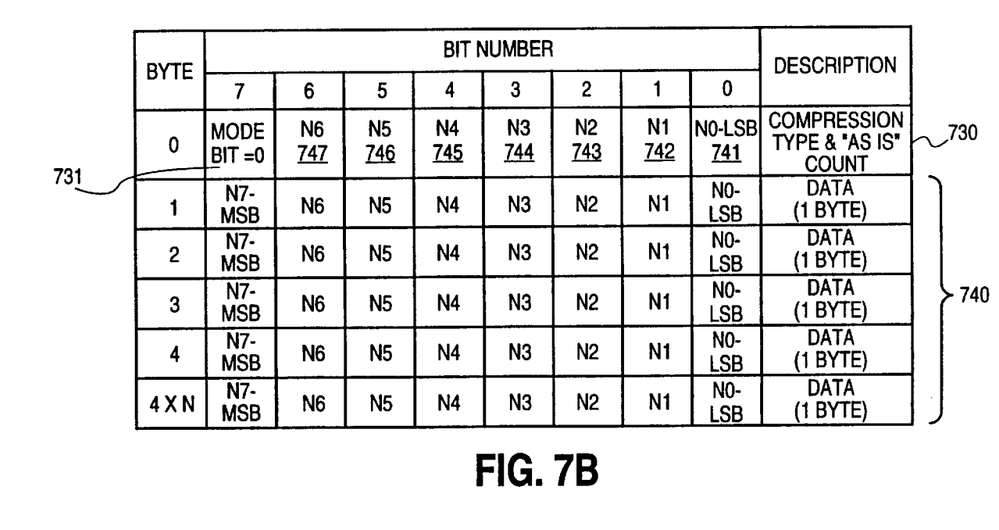
FIG. 7B illustrates one embodiment of a compressed data format for a non-run.

FIG. 7B illustrates one embodiment of a compressed data format for a non-run. The compressed data format for a non-identified run consists of a compression type/count byte 730 and one or more data bytes 740. The compression type/count byte 730 consists of a mode bit 731 and seven count bits 741–747. The mode bit 731 is set to zero to indicate that a run is not identified. The count bits 741–747 are set to indicate the number of 4 byte multiples of consecutive bytes in the data stream that are not similar. The data bytes 740 contain the values of the consecutive non-run bytes. For example, if 8 consecutive bytes in a data stream are different, then the mode bit 731 is set to zero (indicating a non-run) and the count bits 741–747 are set to the value of 8/4=2. The uncompressed data bytes are passed as they are. As such, the data bytes 740 contain each of the different consecutive bytes of the data stream. Because a non-run cannot have a zero count, the condition may be reserved to indicate a particular type of run, for example, a run to the end of an object as discussed above in relation to FIG. 7A.

It should be noted that the compression scheme is not limited to that discussed above in relation to FIGS. 6, 7A, and 7B. In an alternative embodiment, each pixel may be represented by more or less than 8 bits, for example, 2 bits. With some types of systems, the bytes in a data stream may change more frequently. As such, it may not be efficient to look for repetitions of similar bytes in multiples of four, as discussed in relation to FIG. 4. Therefore, the count may be made to represent the actual byte count rather than the count divided by four. For example, using a 2 bit per pixel representation, if there are seven consecutive similar bytes in the uncompressed data stream, the mode bit of a compression type/count byte may be set to one and the count bits may be set to a value of 7. The data byte of the compressed data format is set to have the value of the similar bytes.

If, for example, the next five bytes in the uncompressed data stream are not similar, then the mode bit of the next compression type/count byte is set to zero and the count bits are set to a value of 5. The following compressed data bytes are set to have the values of the five non-similar uncompressed bytes.

Figure 8:
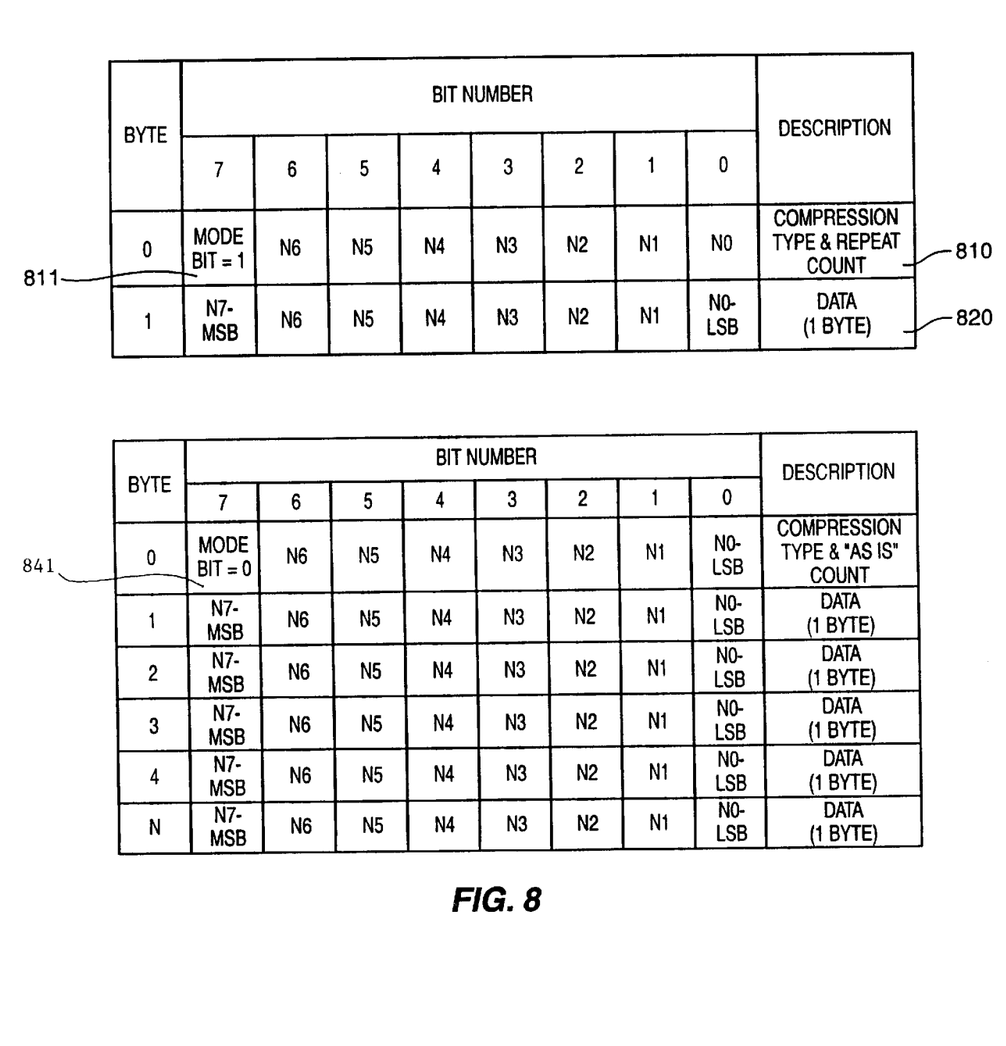
FIG. 8 illustrates another embodiment of a compressed data format.

FIG. 8 illustrates another embodiment of a compressed data format. The bit number 7 of the compression type/repeat count byte 810 is used as the mode bit 811. If a run is identified, then the mode bit 811 is set to 1 and bits N0–N6 are set to the count to repeat the similar bytes identified in the run. As such data byte 820 may be repeated 1, 2, 3, 4 . . . 127 times. Each increment in N results in one additional byte of output.

For the particular case where a run is identified to the end of a scan line and the data byte in the run is repeated a larger number of times than can be represented in a single run, the mode bit 811 is set to 1 and the count bits N0–N6 are set to 0. The data byte 820 is repeated in byte increments until the end of the scan line.

For the particular case where a run is identified to the end of an object, the mode bit 811 may be set to 0 and the count bits N0–N6 of compression byte 810 may be set to 0. The data byte 820 is then repeated in byte increments until the end of the object.

For sections of a data stream where a run is not identified, the mode bit 841 is set to 0 and the counts bits N0–N6 are set as the count to pass the data bytes "as is" to the output. As such, bytes 1–N may be passed "as is" up to 127 bytes. Each increment in N results in one additional byte of data being passed "as is" to the output.

Figure 6:
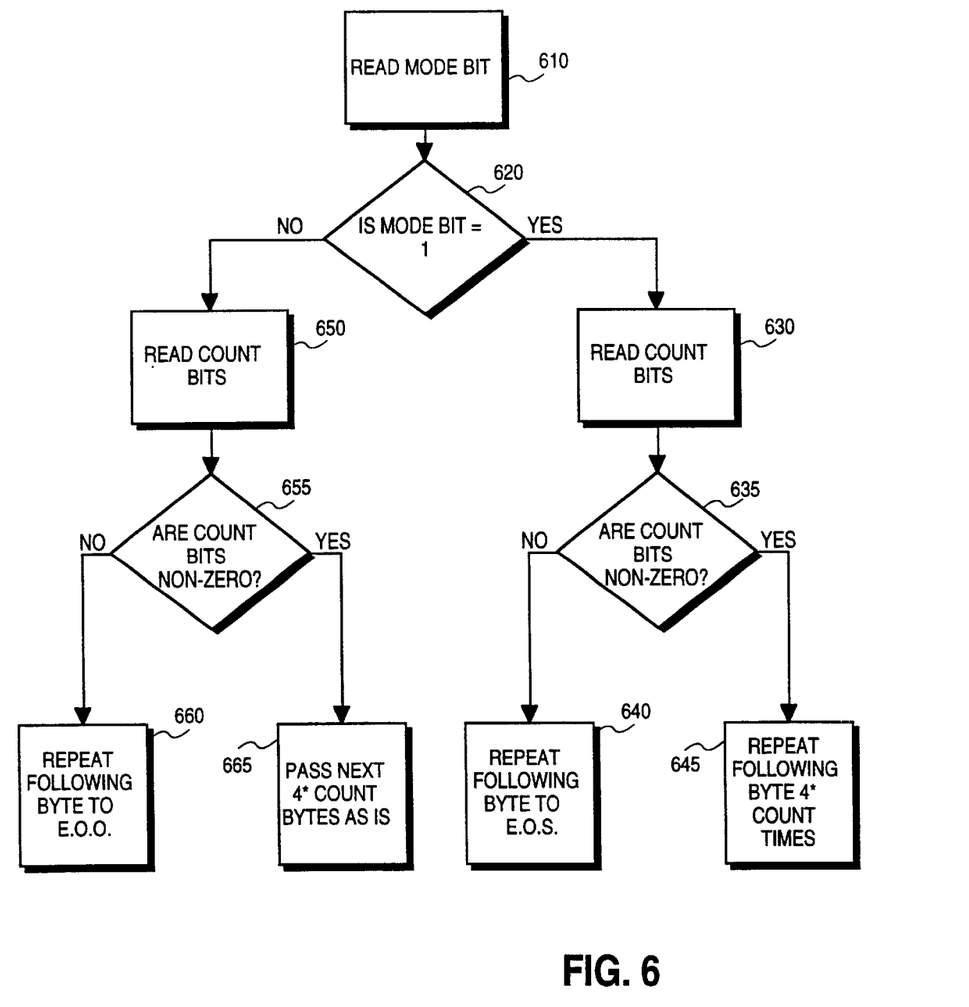
FIG. 6 illustrates a flow chart of one embodiment of a decoding scheme.

FIG. 6 illustrates a flow chart of one embodiment of a decoding scheme based on the compression format discussed above in relation to FIGS. 7A and 7B. In one embodiment, the mode bit is read, step 610, to determine if it is one or zero, step 620. If the mode equals one, then the count bits are read to determine the length of the following byte sequence, step 630. At step 635, it is determined whether the count bits are non-zero. If the count is non-zero, then the byte is repeated by 4 times the count (N0–N6), step 645. As such, the data byte may be repeated, for examples, 4, 8, or 12 times, up to a maximum of 508 times.

For the case of a 2 bits per pixel (bpp) compression scheme, the byte is repeated in single increments (e.g., 1, 2, 3) up to a maximum of 127 times (508 pixels). Since a repeat of 1 may cause an expansion of data rather than a compression of data (requiring two bytes to describe one byte), the non-run of one may be excluded as a non-run value and thus reserved as a description for a new special case condition. For example, in one embodiment, it may be used to provide an extra multiplier code to the count bits found in the byte following this reserved byte. Without the modifier description, only 508 pixels may be presented for a run or non-run count. With the modifier, up to 129,540 pixels (255 times 508) may be specified. For example, a mode bit and count bits may specify a non-run count of one and a data byte of 27 (as a binary count). The following run count of 53, for example, then specifies a run of 5,724 pixels (53 times 4 times 27) instead of the normal 212 (53 times 4) pixels. Otherwise, 11 runs of 508 pixels and 1 run 136 pixels would be needed, requiring 24 bytes of compressed data instead of 4 bytes. In an alternative embodiment, the special case condition may be used to dynamically change the repeat interval (e.g., from four pixels to three or five pixels) to provide the best compression for each segment of data. This may be useful, for example, for shading patterns or screened image data that can be aligned and repeated using a different number of repeated pixels.

Referring still to FIG. 6, if the mode equals one and the count is zero, step 640, this indicates an end of scan (EOS) code. With an EOS code, the following data byte in the data stream is repeated to the end of the scan line. In one embodiment, if the mode equals zero then the count bits are read, step 650. At step 655, the following byte sequence is examined to determine the if the bits count is non-zero. If the count is non-zero, then the next 4*Count bytes are passed to the output as they are ("as is"), step 665. As such, there are up to 508 possible bytes of data (in increments of 4) that are not compressed. For 2 bpp compression, there are up to 127 bytes of data (in single increments) not compressed. If the mode equals zero and the count is zero, this indicates an end of object (EOO) code. With an EOO code, the following byte in the data stream will be repeated to the end of the object (e.g., the remainder of the current scan line and all the remaining scan lines of the object), step 660.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A method of data compression, comprising:
   receiving a data stream having a plurality of bytes; and
   compressing the data stream into a compressed data format by:
      identifying a run of consecutive bytes of the data stream based on the similarity of the consecutive bytes; and
      encoding the identified run by setting a mode bit to a first value based on the identification of the run and setting a plurality of count bits,
   wherein the count bits represent the number of consecutive similar bytes in the run if a non-zero value, and represent a particular type of run if a zero value,
   wherein when the run of consecutive similar bytes continues to an end of a scan line, the first value is one and the plurality of count bits are set to zero.

2. The method of claim 1, wherein compressing the data stream further comprises identifying the run of consecutive similar bytes of the data stream in a predetermined increment of bytes.

3. The method of claim 2, wherein the predetermined increment of bytes is four or one.

4. The method of claim 3, wherein the similarity of the plurality of bytes is based on a bit-wise comparison of the bytes.

5. The method of claim 1, where the plurality of count bits are seven.

6. The method of claim 1, wherein encoding the identified run further comprises setting a data byte to the value of the consecutive similar bytes in the run.

7. The method of claim 1, wherein when a function is needed to encode special operations, the first value is one and the plurality of count bits are set to one.

8. The method of claim 1, wherein when the run of consecutive similar bytes continues to the end of an object, the first value is zero and the plurality of count bits are set to zero.

9. The method of claim 1, wherein compressing the data stream further comprises identifying a sequence of non-similar bytes in the data stream in a predetermined increment of bytes.

10. The method of claim 1, wherein compressing the data stream further comprises encoding a run of consecutive non-similar bytes based on the number of consecutive non-similar bytes and a value of each of the consecutive non-similar bytes.

11. The method of claim 10, wherein the data stream comprises pixel data.

12. A method of data compression, comprising:
   receiving a data stream having a plurality of bytes; and
   compressing the data stream into a compressed data format by:
      identifying a run of consecutive bytes of the data stream based on the similarity of the consecutive bytes; and
      encoding the identified run by setting a mode bit to a first value based on the identification of the run and setting a plurality of count bits, wherein the count bits represent the number of consecutive similar bytes in the run if a non-zero value, and represent a particular type of run if a zero value, wherein when a function is needed to encode special case conditions, the first value is one and the plurality of count bits are set to one.

13. A method of data compression, comprising:

receiving a data stream having a plurality of bytes; and compressing the data stream into a compressed data format by:

identifying a run of consecutive bytes of the data stream based on the similarity of the consecutive bytes; and encoding the identified run by setting a mode bit to a first value based on the identification of the run and setting a plurality of count bits, wherein the count bits represent the number of consecutive similar bytes in the run if a non-zero value, and represent a particular type of run if a zero value, wherein when the run of consecutive similar bytes continues to the end of an object, the first value is zero and the plurality of count bits are set to zero.

14. A machine readable media having stored thereon a sequence of commands which when executed by a processor cause the processor to perform the following:

receiving a data stream having a plurality of bytes; and compressing the data stream into a compressed data format by:

identifying a run of consecutive bytes of the data stream based on the similarity of the consecutive bytes; and encoding the identified run by setting a mode bit to a first value based on the identification of the run and setting a plurality of count bits, wherein the count bits represent the number of consecutive similar bytes in the run if a non-zero value, and represent a particular type of run if a zero value, wherein when the run of consecutive similar bytes continues to an end of a scan line, the first value is one and the plurality of count bits are set to zero.

15. The machine readable media of claim 14, wherein compressing the data stream further comprises identifying the run of consecutive similar bytes of the data stream in a predetermined increment of bytes.

16. The machine readable media of claim 15, wherein the predetermined increment of bytes is four.

17. The machine readable media of claim 16, wherein compressing the data stream further comprises:

identifying a run of consecutive non-similar bytes in the data stream; and encoding the run of consecutive non-similar bytes based on the number of consecutive non-similar bytes and a value of each of the consecutive non-similar bytes.

18. A method of decoding, comprising:

receiving a compression byte having a mode bit and a plurality of count bits, the count bits representing the number of consecutive similar bytes in a run if a non-zero value, and representing a particular type of run if a zero value;

receiving a data byte;

determining a count value for the plurality of count bits and a mode value for the mode bit; and repeating the data byte based on the count value and the mode value;

wherein when the mode bit has a first value, the data byte is repeated a multiple of four times the count value.

19. The method of claim 18, wherein when the count value is zero and the mode bit has the first value, the data byte is repeated to the end of a scan line.

20. The method of claim 19, wherein the first value is one.

21. The method of claim 18, wherein when the count value is zero and the mode bit has a first value, the data bytes is repeated to the end of an object.

22. The method of claim 21, wherein the first value is zero.

23. A method of decoding, comprising:

receiving a compression byte having a mode bit and a plurality of count bits, the count bits representing the number of consecutive similar bytes in a run if a non-zero value, and representing a particular type of run if a zero value;

receiving a data byte;

determining a count value for the plurality of count bits and a mode value for the mode bit;

repeating the data byte based on the count value and the mode value;

wherein when the count value is zero and the mode value is a first value, the data byte is repeated to the end of a scan line.

24. A method of decoding, comprising:

receiving a compression byte having a mode bit and a plurality of count bits, the count bits representing the number of consecutive similar bytes in a run if a non-zero value, and representing a particular type of run if a zero value;

receiving a data byte;

determining a count value for the plurality of count bits and a mode value for the mode bit;

repeating the data byte based on the count value and the mode value;

wherein when the count value is zero and the mode value is a first value, the data byte is repeated to the end of an object.

* * * * *